(12) United States Patent
Schrinsky et al.

(10) Patent No.: US 9,087,737 B2
(45) Date of Patent: *Jul. 21, 2015

(54) METHODS OF FORMING CHARGE STORAGE STRUCTURES INCLUDING ETCHING DIFFUSED REGIONS TO FORM RECESSES

(71) Applicant: Micron Technology, Inc., Boise, ID (US)

(72) Inventors: Alex Schrinsky, Boise, ID (US); Anish Khandekar, Boise, ID (US); Pavan Aella, Boise, ID (US); Niraj B. Rana, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/456,337

(22) Filed: Aug. 11, 2014

(65) Prior Publication Data

US 2014/0349454 A1 Nov. 27, 2014

Related U.S. Application Data

(63) Continuation of application No. 13/205,316, filed on Aug. 8, 2011, now Pat. No. 8,802,525.

(51) Int. Cl.
*H01L 21/336* (2006.01)
*H01L 27/115* (2006.01)
*H01L 21/3213* (2006.01)
*H01L 29/66* (2006.01)
*H01L 29/788* (2006.01)
*H01L 29/792* (2006.01)

(52) U.S. Cl.
CPC .... *H01L 27/11556* (2013.01); *H01L 21/32134* (2013.01); *H01L 27/11582* (2013.01); *H01L 29/66825* (2013.01); *H01L 29/66833* (2013.01); *H01L 29/7889* (2013.01); *H01L 29/7926* (2013.01)

(58) Field of Classification Search
CPC ............ H01L 27/115; H01L 27/11551; H01L 27/11521; H01L 27/11578
USPC ..................... 438/257, 261, 263, 26
See application file for complete search history.

(56) References Cited

U.S. PATENT DOCUMENTS

| 6,312,991 | B1 | 11/2001 | Wang et al. |
| 6,362,049 | B1 | 3/2002 | Cagnina et al. |
| 6,667,511 | B1 | 12/2003 | Fang |
| 7,825,455 | B2 | 11/2010 | Lee et al. |
| 8,492,797 | B2 | 7/2013 | Hwang et al. |
| 8,802,525 | B2 * | 8/2014 | Schrinsky et al. ............ 438/257 |
| 2007/0004099 | A1 | 1/2007 | Choi et al. |
| 2010/0120124 | A1 | 5/2010 | Fernandez Herrero et al. |
| 2012/0001247 | A1 | 1/2012 | Alsmeier |
| 2013/0040429 | A1 | 2/2013 | Schrinsky et al. |

* cited by examiner

*Primary Examiner* — Hsien Ming Lee

(74) *Attorney, Agent, or Firm* — Schwegman Lundberg & Woessner, P.A.

(57) ABSTRACT

Methods are disclosed that include selectively etching diffused regions to form recesses in semiconductor material, and forming charge storage structures in the recesses. Additional embodiments are disclosed.

19 Claims, 4 Drawing Sheets

METHODS OF FORMING CHARGE STORAGE STRUCTURES INCLUDING ETCHING DIFFUSED REGIONS TO FORM RECESSES

PRIORITY APPLICATION

This application is a continuation of U.S. application Ser. No. 13/205,316, filed Aug. 8, 2011, which is incorporated herein by reference in its entirety.

BACKGROUND

Higher memory density is always in demand to provide smaller devices with increased memory capacity. Forming memory devices laterally on a surface of a semiconductor chip uses a great deal of chip real estate. Improved memory devices are needed with new configurations to further increase memory density beyond what is available with traditional devices.

DETAILED DESCRIPTION

In the following detailed description of the invention, reference is made to the accompanying drawings that form a part hereof and in which are shown, by way of illustration, specific embodiments in which the invention may be practiced. These embodiments are described in sufficient detail to enable those skilled in the art to practice the invention. Other embodiments may be utilized and logical, electrical, material changes, etc. may be made.

The term "horizontal" as used in this application is defined as a plane parallel to the conventional plane or surface of a substrate, such as a wafer or die, regardless of the orientation of the substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the substrate, regardless of the orientation of the substrate. The following detailed description is, therefore, not to be taken in a limiting sense, and the scope of the present invention is defined only by the appended claims, along with the full scope of equivalents to which such claims are entitled.

Figure 1A:
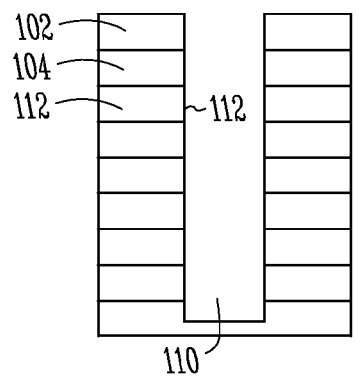
FIGS. 1A-1D show process operations of forming a semiconductor device according to an embodiment of the invention.

FIG. 1A shows a substrate 100 including alternating materials. At least one dielectric material 102 is shown with at least one semiconductor material 104. In one example, the dielectric material 102 includes silicon oxide. In one example, the semiconductor material 104 includes silicon, such as doped polysilicon. In one example, the polysilicon silicon is doped p-type. Acceptable p-type dopants include, but are not limited to boron, aluminum, gallium and indium. In one example, the semiconductor material 104 is heavily doped (p+). In one example, the semiconductor material is doped to a concentration greater than approximately $8 \times 10^{19}$ atoms/cm$^3$.

An opening 110 having a sidewall 112 is shown in the substrate 100. FIG. 1A shows a substantially vertical opening 110 for illustration, however in other examples, the opening 110 may be in a different orientation, such as horizontal. In the example shown, the substrate 100 includes multiple layers of alternating dielectric material 102 and semiconductor material 104. In at least some embodiments, the dielectric material of the various dielectric material layers is the same dielectric material, and/or the semiconductor material of the various semiconductor material layers is the same semiconductor material, although different layers of dielectric material may comprise different dielectric materials and/or different layers of semiconductor material may comprises different semiconductor materials. The example stacked configuration may be useful to form specific devices, such as memory string devices, although the invention is not so limited. Other semiconductor structures will benefit from applying the methods described below.

Figure 1B:
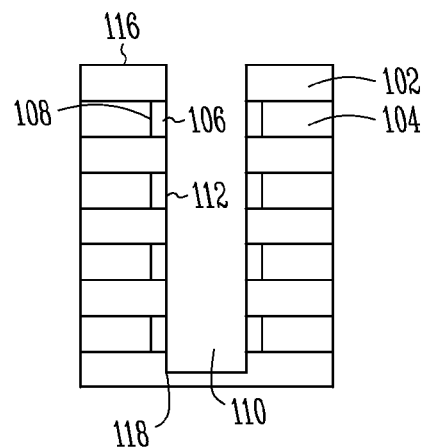

FIG. 1B shows further processing of the substrate 100. A diffused region 106 is shown formed into a semiconductor material 104, with an interface 108 between the diffused region 106 and the semiconductor material 104. In FIG. 1B, multiple diffused regions 106 are shown to form part of the multi-layer stack substrate. In one example, the diffused region 106 is diffused with n-type dopants. Acceptable n-type dopants include, but are not limited to phosphorous, arsenic, and antimony.

The diffusion mechanism of the n-type dopant into the semiconductor material 104 provides a number of useful features with respect to the diffused regions 106 and the opening 110. Diffusion distance into the semiconductor portion 104 is substantially dependent on time, temperature, and concentration of a dopant source. Diffusion distance into the semiconductor material 104 is not substantially affected by aspect ratio or depth of the opening 110. As a result, the diffused regions 106 extend a substantially identical distance into the semiconductor material 104 at the top 116 and the bottom 118 of the opening 110. Although diffusion of an n-type dopant is used as an example, other dopants, such as p-type dopants, that provide etching selectivity are also within the scope of the invention.

In one example, phosphorous is used as the n-type dopant. One example of phosphorous diffusion includes furnace processing using phosphine as a phosphorous source. Another example of phosphorous diffusion includes furnace processing using POCl$_3$ gas as a phosphorous source. Another example of phosphorous diffusion includes deposition of a phosphorous doped material on an exposed surface of the semiconductor material 104, and a subsequent anneal to drive the phosphorous into the semiconductor material 104. Example materials to provide dopants to diffuse into the exposed surface of the semiconductor material 104 include phosphorous doped polysilicon, or phospho-silicate glass. Examples of deposition include chemical vapor deposition and pulsed laser ablation deposition.

Figure 1C:
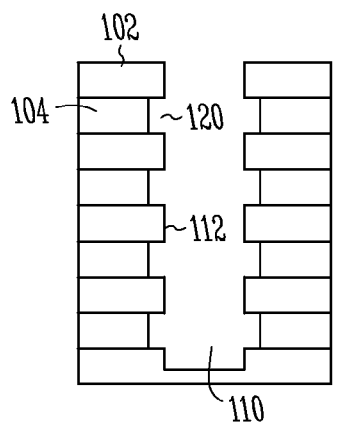

FIG. 1C shows further processing of the substrate 100. In FIG. 1C, the diffused regions 106 are removed through an etching process, leaving recesses 120. Because the diffused regions 106 are n-type, and the semiconductor material 104 is p-type, the interface 108 serves as an etch stop. A number of etchant processes are available that are selective between n-type and p-type silicon. For example, a number of etchant processes are available that are highly selective between n-type and heavily doped p-type silicon. One example includes wet etch processes. In one example, hydroxyl chemistry wet etch processes are used. One example of wet etch chemistry includes $NH_4OH$ etchants. Another example of wet etch chemistry includes tetramethylammonium hydroxide (TMAH) etchants. Another example of wet etch chemistry includes potassium hydroxide (KOH) etchants. In embodiments where dopants other than n-type are used to form the interface 108, an appropriate etchant is chosen with selectivity to the chosen dopant.

Attempting to etch a same doped semiconductor material 104 by itself presents a number of technical challenges. P+ doped silicon, for example, is difficult to etch at an appreciable rate using wet etch chemistries based on hydroxides. $HF—HNO_3$ based chemistries can etch p+ doped silicon, however $HF—HNO_3$ based chemistries are not sufficiently selective with respect to dielectrics such as silicon oxide. Plasma etch is sensitive to aspect ratio, such that a layer of material at the bottom 118 of the opening 110 may etch more slowly than a layer of material at the top 116 of the opening 110.

In the processes of an embodiment of the present invention, diffusion of n-type dopants into the semiconductor material 104 is substantially insensitive to aspect ratio or depth within the opening 110. Subsequent etchant chemistries, such as the example hydroxyl chemistries listed above, are available that are selective between n-type and p-type silicon, and selective with respect to dielectrics such as silicon oxide. As a result, the recesses 120 formed are substantially consistent in their distance into the semiconductor material 104 from a sidewall 112 of the opening 110 from the top 116 to the bottom 118 of the opening 110.

Figure 1D:
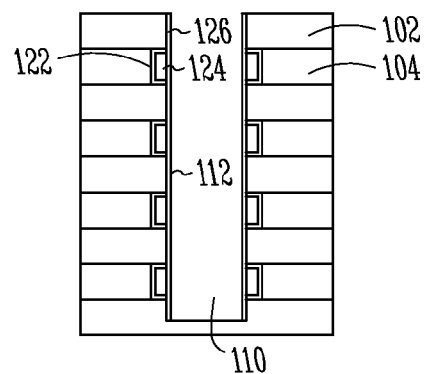

FIG. 1D shows further processing of the substrate 100. A first cell dielectric (e.g., a gate oxide) 122 is formed within the recesses 120. A charge storage structure, such as a floating gate 124 or trap material, is then formed over the first cell oxide 122 in the recesses 120. A second gate oxide 126 is then formed over the floating gate 124. Consistently sized recesses 120 yield consistently sized charge storage structures (e.g., floating gates), and consistently sized charge storage structures provide consistent operating characteristics in memory devices. In subsequent process operations, an elongated channel region (not shown) may be formed within the opening 110 to form a memory string, such a NAND memory string.

FIG. 1D shows the formation of floating gates 124 in the recesses 120. In other examples, different charge storage structures may be formed within the recesses 120. Another example of possible charge storage structures may include nitride trap layers (e.g., as part of an oxide-nitride-oxide structure).

Figure 2A:
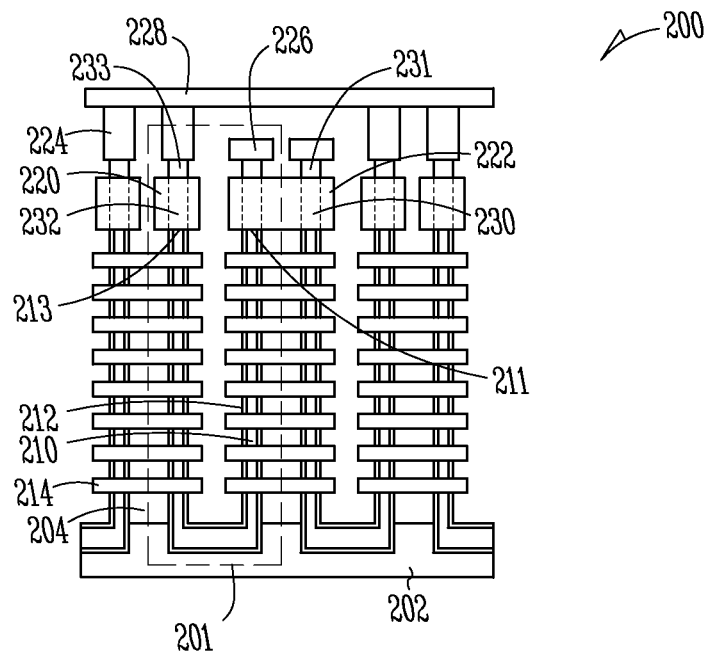
FIG. 2A shows a memory device according to an embodiment of the invention.

As discussed above, memory devices are one type of semiconductor device that may be formed using the etching processes described. FIG. 2A shows an example memory device formed using the processes shown in FIGS. 1A-1D. FIG. 2A shows a dielectric 212 that substantially surrounds an elongated channel region 210. A plurality of memory cell gates 214 are shown along the elongated channel region 210, defining a plurality of memory cells. In one example, the memory cell gates 214 include floating gates, such as floating gates 124 from FIG. 1D. A first select gate 220 and a second select gate 222 are shown to selectively electrically couple the elongated channel region 210 to drain region 232 and a source region 230, respectively. A dielectric 204 can fill in spaces between two or more of the components described above.

FIG. 2A shows an embodiment of a memory device 200 where the elongated channel region 210 forms a "U" shape with a pair of upward facing ends 211, 213. In one example, a "U" shaped channel region is formed in a pair of openings, such as opening 110 from FIGS. 1A-1D, that are connected at their respective bottoms 118. Another example configuration includes a linear, vertical, elongated channel region 210 with one end facing upward, and the other end facing downward. Embodiments with two upward facing ends, 211, 213, such as the substantially "U" shaped configuration, enable easier formation of some components at the ends 211, 213 of the elongated channel region 210 during manufacture, compared to embodiments where components are formed deeper in the structure.

In one example, the elongated channel region 210 comprises n type semiconductor material, such as n-type polysilicon. A source region 230 and a drain region 232 are shown coupled to a first end 211 and a second end 213 of the elongated channel region 210, respectively. In one example, the source region 230 and the drain region comprises p type semiconductor material, such as p-polysilicon. In operation, the pathway of source region 230, to elongated channel region 210, to drain region 232 acts as a p-n-p transistor, with select gates 220, 222, and memory cell gates 214 operating to allow, or inhibit signal transmission along the way. In the example shown, the source region 230, elongated channel region 210, drain region 232, select gates 220, 222, and memory cell gates 214 collectively form a memory cell string 201. In the example shown in FIG. 2A, each memory cell string 201 has a separate drain select gate 220, while a source select gate 222 is shared between adjacent memory cell strings 201.

A source line 226 and a data line, such as bitline 228, are shown coupled to the source region 230 and the drain region 232 respectively. In one embodiment, a plug 224 is used to couple the bitline 228 to the drain region 232. Each of the source line 226, bitline 228 and plug 224 can comprise, consist of, or consist essentially of metal, such as aluminum, copper, or tungsten, or alloys of these or other conductor metals. As used herein, the term "metal" further includes metal nitrides, or other materials that operate primarily as conductors.

Figure 2B:
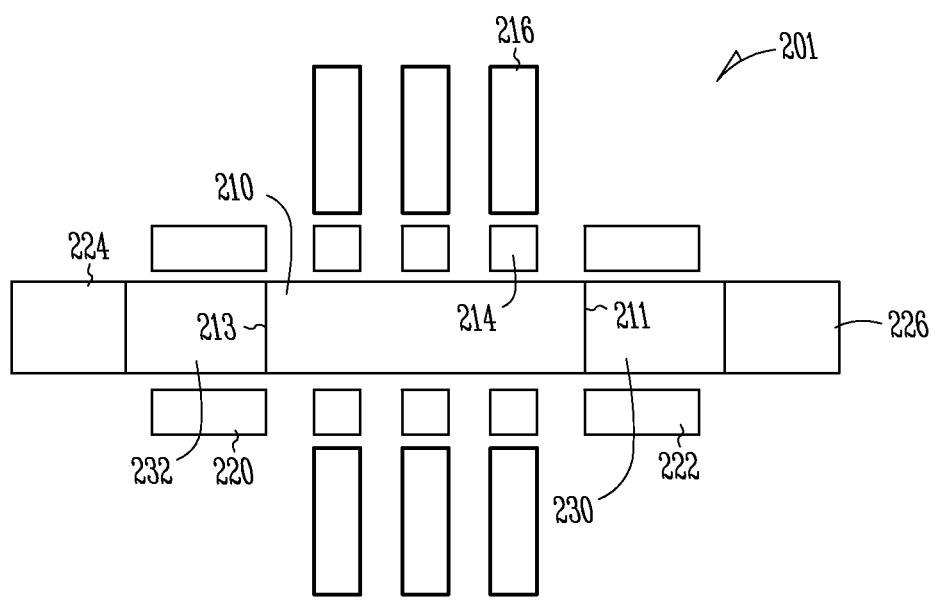
FIG. 2B shows a block diagram of a portion of the memory device from FIG. 1A according to an embodiment of the invention.

FIG. 2B shows a block diagram of memory cell string 201 from FIG. 2A. The elongated channel region 210 is shown, with a number of floating gates 214 and a number of control gates 216. The select gates 220, 222 are shown adjacent to the first end 211 and the second end 213 of the elongated channel region 210.

Figure 3:
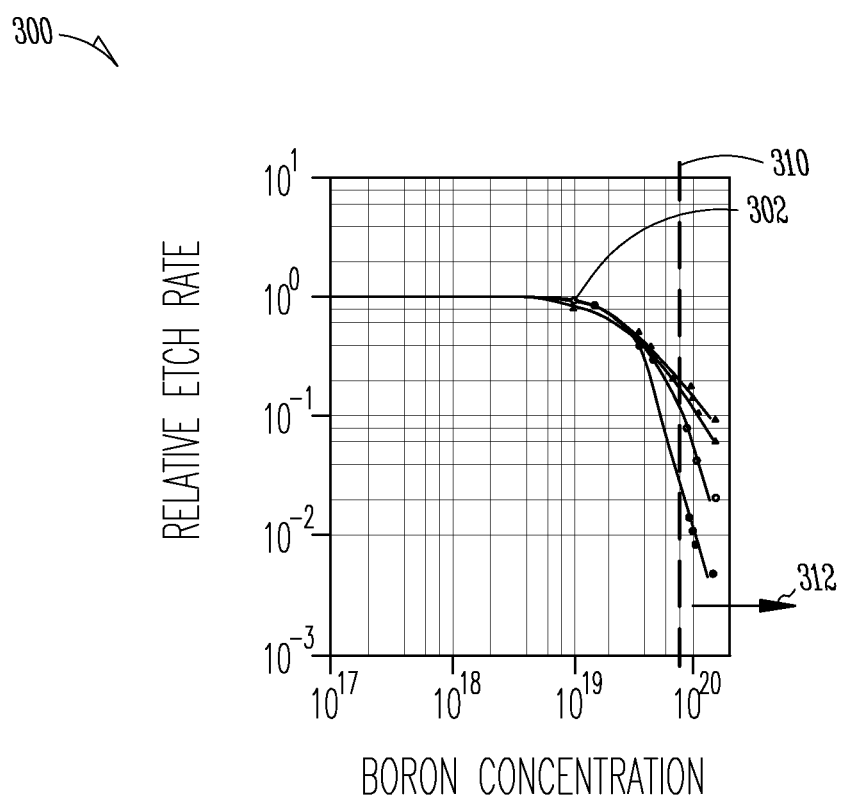
FIG. 3 shows a graph of etch rate versus boron concentration according to an embodiment of the invention.

FIG. 3 shows a graph 300 of etch rate versus boron concentration for an example wet etchant according to an embodiment of the invention. Potassium hydroxide as an etchant is illustrated in FIG. 3, however similar etch rate characteristics as a function of dopant concentrations are found with respect to other hydroxyl etchant chemistries.

FIG. 3 shows a marked change in etch rate at boron concentrations beginning at point 302 on the graph. At concentrations greater than about $8 \times 10^{19}$ atoms/cm$^3$ shown at line 310 the etch rate for potassium hydroxide has dropped off significantly from the steady rate to the left of point 302. As illustrated by the graph 300, with boron concentrations greater than about $8 \times 10^{19}$ atoms/cm$^3$ indicated by arrow 312, potassium hydroxide does not significantly etch. This property provides selectivity between n-type and p-type materials, as described in relation to FIGS. 1A-1D above. This selectivity allows the interface between p-type and n-type materials to serve as an etch stop, where etching substantially stops. While some level of etching may continue to occur at an etch stop, because of the order of magnitude differences in etch rate (such as the example in FIG. 3), the etching is considered to have substantially stopped. In one example, the etch stop interface includes etch selectivity greater than approximately 20 to 1. The etch stop provides a process to form consistently-sized structures, such as floating gates, within high aspect ratio openings in devices such as vertical NAND memory devices.

In one specific example using TMAH, testing provided the following etch rate results.

| Solution | temp (° C.) | Etch rate (μm/min) | | | |
|---|---|---|---|---|---|
| | | 1e21 B | 3e18 B | 1e15 B | 3e14 P |
| TMAH 10:1 | 66 | | 0.599 | | 0.62 |
| | 78 | | 0.833 | 0.598 | 0.84 |
| | 65 | ~0.0020 | | | |

The table confirms that heavily doped boron (for example $1 \times 10^{21}$ atoms/cm$^3$ in the table) has a dramatic fall in etch rate.

Figure 4:
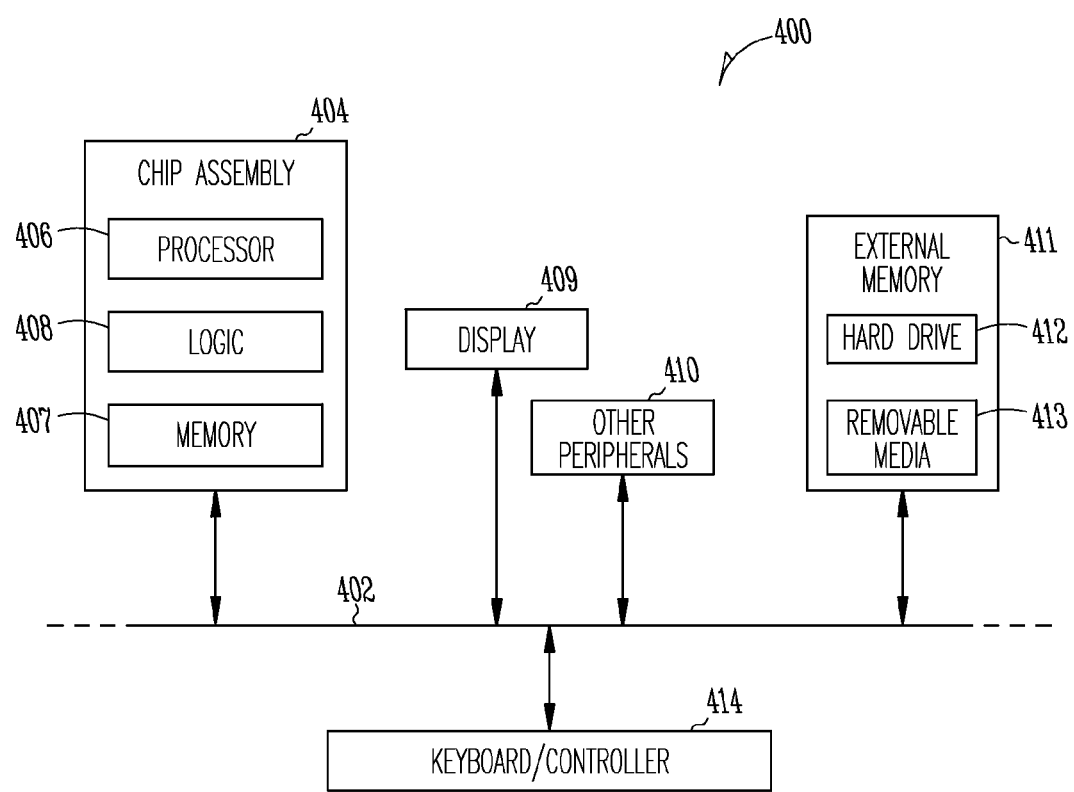
FIG. 4 shows an information handling system using a memory device according to an embodiment of the invention.

An embodiment of an information handling system such as a computer is included in FIG. 4 to show an embodiment of a high-level device application for some embodiments of the present invention. FIG. 4 is a block diagram of an information handling system 400 incorporating a memory device 407 formed according to embodiments of the invention as described above. Information handling system 400 is merely one embodiment of an electronic system in which decoupling systems of the present invention can be used. Other examples of such systems include, but are not limited to, tablet computers, cameras, personal data assistants (PDAs), cellular telephones, MP3 players, aircraft, satellites, military vehicles, etc.

In this example, information handling system 400 comprises a data processing system that includes a system bus 402 to couple the various components of the system. System bus 402 provides communications links among the various components of the information handling system 400 and may be implemented as a single bus, as a combination of busses, or in any other suitable manner.

Chip assembly 404 is coupled to the system bus 402. Chip assembly 404 may include any circuit or operably compatible combination of circuits. In one embodiment, chip assembly 404 includes a processor 406 that can be of any type. As used herein, "processor" means any type of computational circuit such as, but not limited to, a microprocessor, a microcontroller, a graphics processor, a digital signal processor (DSP), or any other type of processor or processing circuit.

In one embodiment, a memory device 407 is included in the chip assembly 404. In one embodiment, the memory device 407 includes a NAND memory device formed according to embodiments described above. In one embodiment, the processor 406 and memory device 407 are formed on the same chip.

In one embodiment, additional logic chips 408 other than processor chips are included in the chip assembly 404. An example of a logic chip 408 other than a processor includes an analog to digital converter. Other circuits on logic chips 408 such as custom circuits, an application-specific integrated circuit (ASIC), etc. are also included in one embodiment of the invention.

Information handling system 400 may also include an external memory 411, which in turn can include one or more memory elements suitable to the particular application, such as one or more hard drives 412, and/or one or more drives that handle removable media 413 such as compact disks (CDs), flash drives, digital video disks (DVDs), and the like. A semiconductor memory die constructed as described in examples above is included in the information handling system 400.

Information handling system 400 may also include a display device 409 such as a monitor, additional peripheral components 410, such as speakers, etc. and a keyboard and/or controller 414, which can include a mouse, touch sensor, voice-recognition device, or any other user interface device that permits a system user to input information into and receive information from the information handling system 400.

While a number of embodiments of the invention are described, the above lists are not intended to be exhaustive. Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of the present invention. It is to be understood that the above description is intended to be illustrative and not restrictive. Combinations of the above embodiments, and other embodiments, will be apparent to those of skill in the art upon studying the above description.

What is claimed is:

1. A method of forming a memory string, comprising:
    forming a stack of alternating layers of semiconductor material and dielectric material;
    forming an opening within the stack;
    diffusing a dopant into the semiconductor material exposed to the opening to form a plurality of diffused regions, each of the diffused regions extending a distance into the semiconductor material from a sidewall of the opening;
    selectively etching the diffused regions to form recesses in the semiconductor material, wherein etching substantially stops at each interface between the semiconductor material and the diffused regions;
    forming charge storage structures within the recesses; and
    forming a channel region within the opening.

2. The method of claim 1, further including coupling two adjacent channel regions together to form a "U" shaped channel region.

3. The method of claim 1, wherein forming an opening within the stack includes forming a vertical opening within the stack.

4. The method of claim 1, wherein forming charge storage structures within the recesses includes forming floating gates within the recesses.

5. The method of claim 1, wherein forming charge storage structures within the recesses includes forming nitride trap layers.

6. The method of claim 1, wherein diffusing a dopant into the semiconductor material includes diffusing a concentration of dopant atoms into a p-type semiconductor material at a concentration greater than $8 \times 10^{19}$ atoms/cm$^3$.

7. A method of forming a memory device, comprising:
    forming a number of memory strings, wherein forming the memory strings includes:
        forming a stack of alternating silicon and dielectric layers;
        forming an opening within the stack;
        forming a P-N interface within the opening in the stack with n-type regions being exposed within the opening;
        selectively etching the n-type regions to form recesses wherein etching substantially stops at the P-N interface;
        forming charge storage structures within the recesses;
        forming a channel region within the opening; and coupling the number of memory strings together using source lines and data lines.

8. The method of claim 7, further including forming select gates associated with each memory string.

9. The method of claim 8, wherein forming select gates includes forming a source select gate and a drain select gate associated with each memory string.

10. The method of claim 7, wherein forming charge storage structures within the recesses includes forming floating gates within the recesses.

11. The method of claim 7, wherein forming charge storage structures within the recesses includes forming nitride trap layers.

12. The method of claim 7, wherein forming a stack of alternating silicon and dielectric layers includes forming a number of p-type silicon layers alternating with dielectric layers.

13. The method of claim 7, wherein selectively etching the n-type regions includes wet etching.

14. A method of forming an information handling system, comprising:
    forming a number of memory strings, wherein forming the memory strings includes:
        forming a stack of alternating silicon and dielectric layers;
        forming an opening within the stack;
        forming a P-N interface within the opening in the stack with selective etch regions being exposed within the opening;
        selectively etching the selective etch regions to form recesses wherein etching substantially stops at the P-N interface;
        forming charge storage structures within the recesses;
        forming a channel region within the opening;
    coupling the number of memory strings together using source lines and data lines; and
    coupling a processor to the number of memory strings through the source lines and data lines.

15. The method of claim 14, wherein forming a P-N interface within the opening includes forming a P-N interface within the opening in the stack with n-type etch regions being exposed within the opening.

16. The method of claim 14, wherein forming a P-N interface within the opening includes forming a P-N interface within the opening in the stack with p-type etch regions being exposed within the opening.

17. The method of claim 14, wherein coupling a processor to the number of memory strings includes coupling a multi-core processor to the number of memory strings.

18. The method of claim 14, wherein forming a P-N interface within the opening includes diffusing an n-type dopant into a p-type layer.

19. The method of claim 18, wherein diffusing an n-type dopant into a p-type layer includes diffusing phosphorous into a boron doped layer.

* * * * *